(12) United States Patent
Ino

(10) Patent No.: US 11,855,206 B2
(45) Date of Patent: Dec. 26, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masataka Ino, Oita Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 37 days.

(21) Appl. No.: 17/464,620

(22) Filed: Sep. 1, 2021

(65) Prior Publication Data
US 2022/0262952 A1 Aug. 18, 2022

(30) Foreign Application Priority Data
Feb. 18, 2021 (JP) .................................. 2021-023985

(51) Int. Cl.
*H01L 29/78* (2006.01)
*H01L 27/088* (2006.01)

(52) U.S. Cl.
CPC ........ *H01L 29/7842* (2013.01); *H01L 27/088* (2013.01)

(58) Field of Classification Search
CPC ............... H01L 29/7842; H01L 27/088; H01L 21/823475; H01L 21/823487; H01L 29/41741; H01L 29/7831; H01L 29/7813; H01L 29/0603; H01L 29/0684; H01L 29/0696; H01L 29/1095; H01L 29/7375; H01L 29/7393–7395; H01L 29/7397; H01L 29/66325; H01L 29/66333–66348; H01L 27/1158; H01L 27/11273; H01L 29/66712–66734; H01L 29/7802–7815;
(Continued)

(56) References Cited

U.S. PATENT DOCUMENTS 9,111,988 B2 8/2015 Nagaoka
2021/0074844 A1* 3/2021 Kojima ............... H01L 29/7809

FOREIGN PATENT DOCUMENTS

JP 2013-165110 A 8/2013
JP 2014-160779 A 9/2014
JP 2016-086006 A 5/2016

* cited by examiner

*Primary Examiner* — Cuong B Nguyen
(74) *Attorney, Agent, or Firm* — Kim & Stewart LLP

(57) ABSTRACT

A semiconductor device includes first and second metal layers, a dielectric layer, first, second, and third semiconductor regions, a first control electrode, and a first electrode. The dielectric layer is located on the first metal layer. The second metal layer is located on the dielectric layer, and electrically connected with the first metal layer. The first semiconductor region is located on the second metal layer and electrically connected with the second metal layer. The second semiconductor region is located on the first semiconductor region. The third semiconductor region is located on the second semiconductor region. The first control electrode faces the second semiconductor region via a first insulating film. The first electrode is located on the third semiconductor region and the first control electrode, electrically connected with the third semiconductor region, and insulated from the first control electrode by a first insulating portion.

15 Claims, 7 Drawing Sheets

(58) Field of Classification Search
CPC . H01L 29/66666; H01L 29/7827–7828; H01L 29/78642; H01L 51/057
See application file for complete search history.

SEMICONDUCTOR DEVICE

CROSS-REFERENCE TO RELATED APPLICATIONS

This application is based upon and claims the benefit of priority from Japanese Patent Application No. 2021-023985, filed on Feb. 18, 2021; the entire contents of which are incorporated herein by reference.

FIELD

Embodiments relate to a semiconductor device.

BACKGROUND

Warp may occur in a wafer in the manufacturing processes of a semiconductor device included in the wafer. There is a risk that the warp of the wafer may reduce the manufacturing efficiency of the semiconductor device. It is desirable to suppress the warp of the semiconductor device.

DETAILED DESCRIPTION

Figure 1:
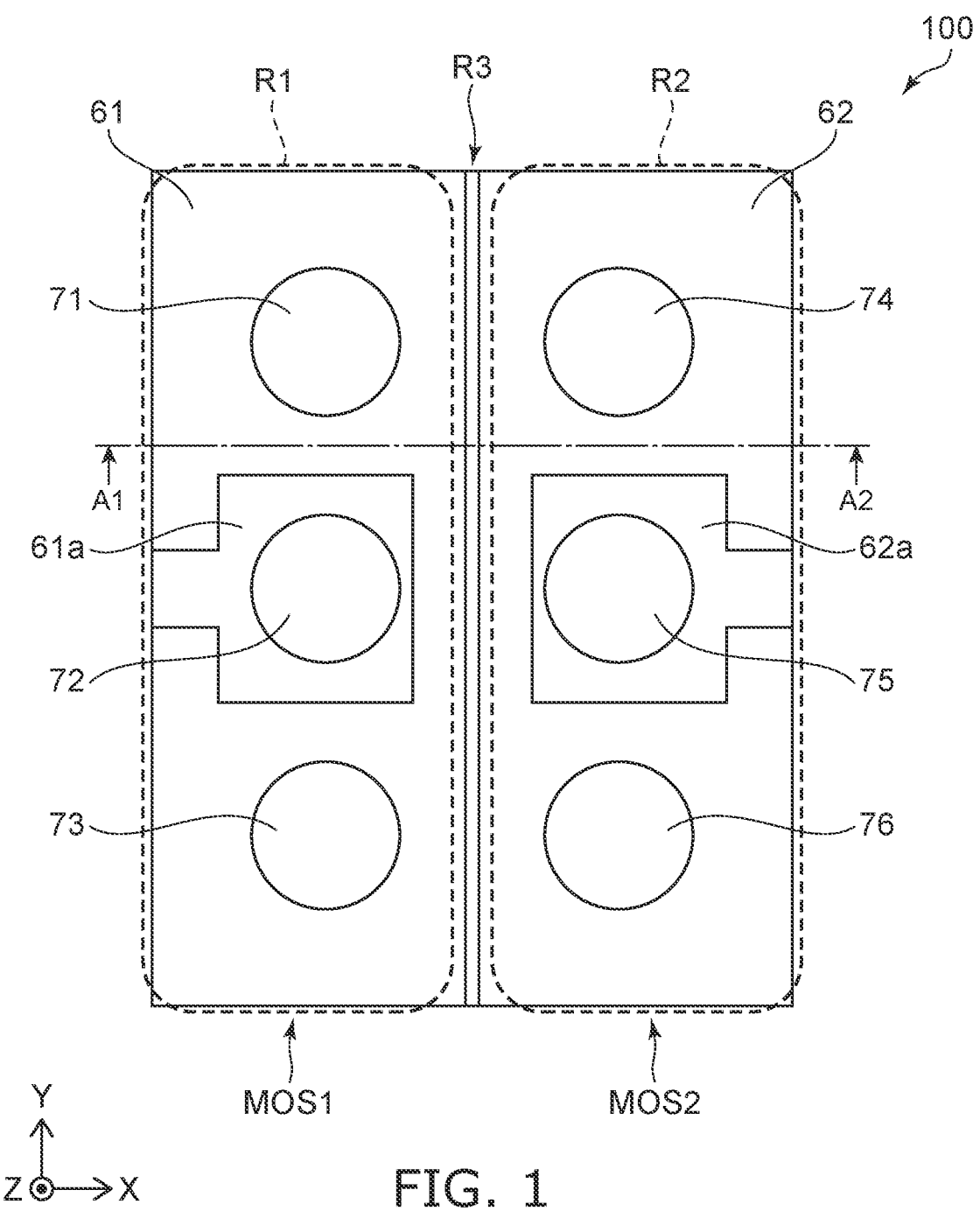
FIG. 1 is a plan view illustrating a semiconductor device according to an embodiment.

A semiconductor device includes a first metal layer, a dielectric layer, a second metal layer, a first semiconductor region, a second semiconductor region, a third semiconductor region, a first control electrode, and a first electrode. The dielectric layer is located on the first metal layer. The second metal layer is located on the dielectric layer. The second metal layer is electrically connected with the first metal layer. The first semiconductor region is located on the second metal layer and electrically connected with the second metal layer. The first semiconductor region is of a first conductivity type. The second semiconductor region is located on the first semiconductor region. The second semiconductor region is of a second conductivity type. The third semiconductor region is located on the second semiconductor region. The third semiconductor region is of the first conductivity type. The first control electrode faces the second semiconductor region via a first insulating film. The first electrode is located on the third semiconductor region and the first control electrode. The first electrode is electrically connected with the third semiconductor region. The first electrode is insulated from the first control electrode by a first insulating portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^{++}$, $n^{+}$, and $n^{-}$ indicate relative levels of the impurity concentrations. In other words, a notation marked with "+" indicates that the impurity concentration is relatively greater than that of a notation not marked with either "+" or "−", and a notation marked with "−" indicates that the impurity concentration is relatively less than that of a notation without any mark. A notation marked with "++" indicates that the impurity concentration is relatively greater than that of a notation marked with "+". When both a p-type impurity and an n-type impurity are included in each region, these notations indicate relative levels of the net impurity concentrations after the impurities are compensated.

In the embodiments described below, each embodiment may be implemented by inverting the p-type (an example of the second conductivity type) and the n-type (an example of the first conductivity type) of each semiconductor region.

FIG. 1 is a plan view illustrating a semiconductor device according to an embodiment.

As illustrated in FIG. 1, the semiconductor device 100 according to the embodiment includes a first element region R1 and a second element region R2 that are arranged in an X-direction. A first element MOS1 is located in the first element region R1; and a second element MOS2 is located in the second element region R2. The first element MOS1 and the second element MOS2 are transistors. An element (a transistor) is not included in a middle region R3 located between the first element region R1 and the second element region R2.

The semiconductor device according to the embodiment may not always include two transistors, and may include one transistor. In other words, the second element region R2 and/or the middle region R3 may not always be included.

A source electrode 61, a first electrode pad 71, a second electrode pad 72, and a third electrode pad 73 are located at the surface of the first element region R1. The first to third electrode pads 71 to 73 are arranged in a Y-direction. The second electrode pad 72 is positioned between the first electrode pad 71 and the third electrode pad 73. The source electrode 61 includes an opening 61a and covers substantially the entire first element region R1 other than the region in which the opening 61a is located. The first electrode pad 71 and the third electrode pad 73 are, for example, source electrode pads and are electrically connected with the source electrode 61. The second electrode pad 72 is, for example, a gate electrode pad that is electrically connected with a gate electrode 41 (referring to FIG. 2), is located in the opening 61a, and is insulated from the source electrode 61.

Similarly, a source electrode 62, a fourth electrode pad 74, a fifth electrode pad 75, and a sixth electrode pad 76 are located at the surface of the second element region R2. The fourth to sixth electrode pads 74 to 76 are arranged in the Y-direction. The fifth electrode pad 75 is positioned between the fourth electrode pad 74 and the sixth electrode pad 76. The source electrode 62 includes an opening 62a and covers substantially the entire second element region R2 other than the region in which the opening 62a is located. The fourth electrode pad 74 and the sixth electrode pad 76 are, for example, source electrode pads and are electrically connected with the source electrode 62. The fifth electrode pad 75 is, for example, a gate electrode pad that is electrically connected with a gate electrode 42 (referring to FIG. 2), is located in the opening 62a, and is insulated from the source electrode 62.

In the structure of the example, the first element region R1 and the second element region R2 are symmetric around the middle region R3 that extends in the Y-direction.

Figure 2:
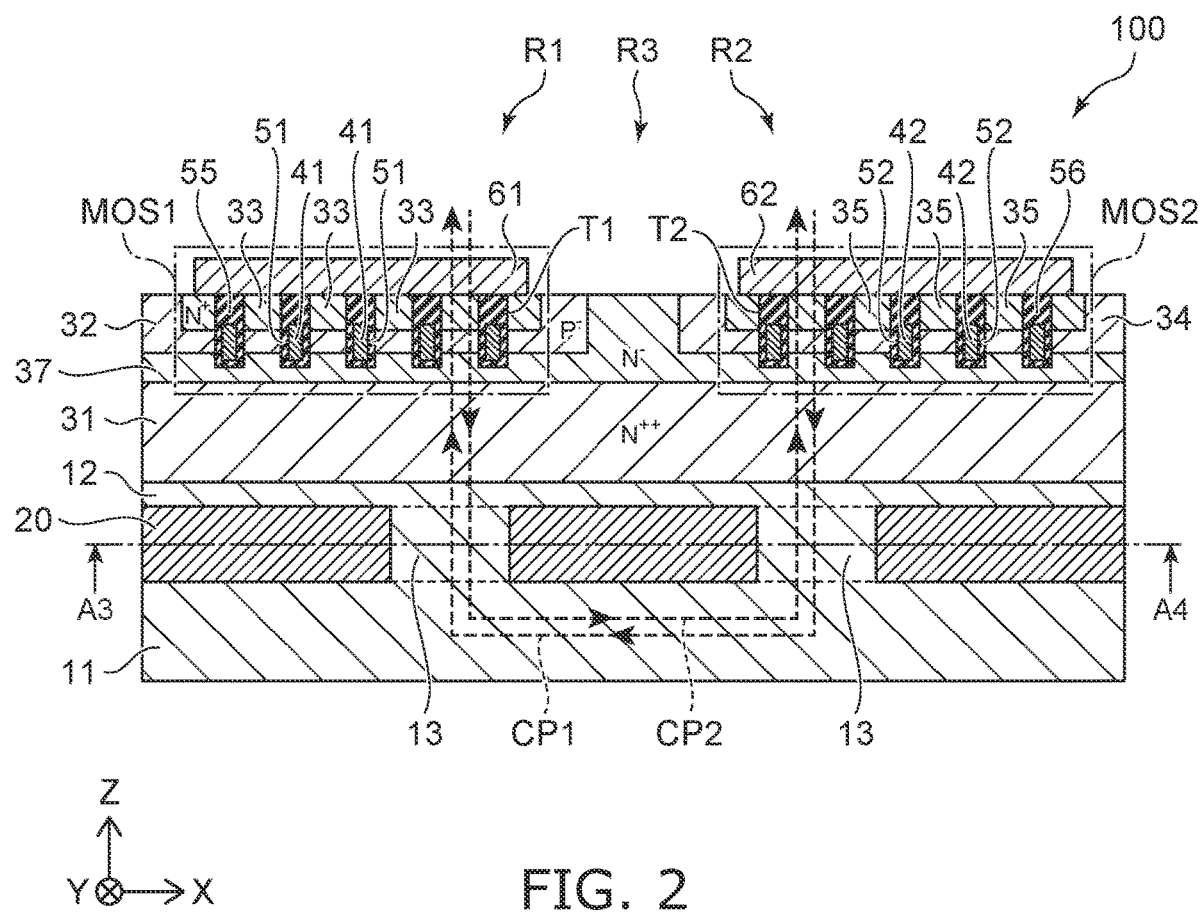
FIG. 2 is a cross-sectional view illustrating the semiconductor device according to the embodiment.

FIG. 2 is a cross-sectional view illustrating the semiconductor device according to the embodiment.

FIG. 2 illustrates a line A1-A2 cross section illustrated in FIG. 1. As illustrated in FIG. 2, the semiconductor device 100 according to the embodiment includes a first metal layer 11, a second metal layer 12, a conductive part 13, a dielectric layer 20, and a semiconductor region 31 (a first semiconductor region). These components are located in the first element region R1, the second element region R2, and the middle region R3.

According to the description of the embodiments, a direction from the first metal layer 11 toward the second metal layer 12 is taken as a Z-direction (a first direction); one direction perpendicular to the Z-direction is taken as the X-direction (a second direction); and a direction perpendicular to the Z-direction and the X-direction is taken as the Y-direction (a third direction). In the description, the direction from the first metal layer 11 toward the second metal layer 12 is called "up"; and the opposite direction is called "down". These directions are based on the relative positional relationship between the first metal layer 11 and the second metal layer 12, and are independent of the direction of gravity.

The dielectric layer 20 is located on the first metal layer 11 and contacts the upper surface of the first metal layer 11. The second metal layer 12 is located on the dielectric layer 20 and contacts the upper surface of the dielectric layer 20. The conductive part 13 is arranged with the dielectric layer 20 in a direction perpendicular to the Z-direction and contacts the side surface of the dielectric layer 20. The second metal layer 12 and the first metal layer 11 are electrically connected by the conductive part 13. The conductive part 13 may be formed as a continuous body with at least one of the first metal layer 11 or the second metal layer 12.

For example, the first metal layer 11, the second metal layer 12, and the dielectric layer 20 each apply stress to the semiconductor region 31. For example, the first metal layer 11 applies compressive stress to the semiconductor region 31 (stress that compresses the semiconductor region 31) so that the first metal layer 11 contracts in a direction along the X-Y plane. For example, the second metal layer 12 applies compressive stress to the semiconductor region 31 so that the second metal layer 12 contracts in a direction along the X-Y plane.

On the other hand, for example, the stress that the dielectric layer 20 applies to the semiconductor region 31 includes an opposite-direction component of the direction of the stress applied to the semiconductor region 31 by at least one of the first metal layer 11 or the second metal layer 12. For example, the dielectric layer 20 applies stress in the opposite direction of both the stress due to the first metal layer 11 and the stress due to the second metal layer 12. More specifically, for example, the dielectric layer 20 applies tensile stress (stress that stretches the semiconductor region 31) to the semiconductor region 31 so that the dielectric layer 20 elongates in a direction along the X-Y plane.

For example, there are cases where stress is generated in film formation processes due to the thermal expansion coefficient (linear expansion coefficient) difference between the layers, temperature changes, etc. For example, the thermal expansion coefficient of the first metal layer 11 is greater than the thermal expansion coefficient of the dielectric layer 20 and the thermal expansion coefficient of the semiconductor region 31. For example, the thermal expansion coefficient of the second metal layer 12 is greater than the thermal expansion coefficient of the dielectric layer 20 and the thermal expansion coefficient of the semiconductor region 31.

The thickness (the length along the Z-direction) of the first metal layer 11 is greater than the thickness of the second metal layer 12. The thickness of the dielectric layer 20 is greater than the thickness of the second metal layer 12.

The semiconductor region 31 is located on the second metal layer 12. The semiconductor region 31 is of an n-type (a first conductivity type). For example, the semiconductor region 31 and the second metal layer 12 have an ohmic contact. A semiconductor region 37 is located on the semiconductor region 31. For example, the semiconductor region 31 is of the $n^{++}$-type; and the semiconductor region 37 is of the $n^{-}$-type. In other words, for example, the n-type impurity concentration of the semiconductor region 31 is greater than the n-type impurity concentration of the semiconductor region 37.

A base region 32 (a second semiconductor region), a source region 33 (a third semiconductor region), the gate electrode 41 (a first control electrode), and a gate insulating film 51 (a first insulating film) are located in the first element region R1. The first element MOS1 is a field effect transistor (e.g., a metal-oxide-semiconductor field-effect transistor (MOSFET)) that is formed of the gate insulating film 51, the gate electrode 41, the source region 33, the base region 32, and a portion of the semiconductor region 37.

The base region 32 is located selectively on the semiconductor region 37. The base region 32 is of the p-type (a second conductivity type).

The source region 33 is located selectively on the base region 32. The source region 33 is of the first conductivity type (the $n^{+}$-type). For example, the n-type impurity concentration of the source region 33 is greater than the n-type impurity concentration of the semiconductor region 37 and less than the n-type impurity concentration of the semiconductor region 31. Multiple source regions 33 are provided in the example; and the multiple source regions 33 are arranged in the X-direction.

The gate electrode 41 is located on the semiconductor region 37 with the gate insulating film 51 interposed. The gate electrode 41 faces a portion of the semiconductor region 37, the base region 32, and a portion of the source region 33 via the gate insulating film 51. Multiple gate electrodes 41 and multiple gate insulating films 51 are provided in the example. The multiple gate electrodes 41 are arranged in the X-direction; and each gate electrode 41 extends in the Y-direction. The gate electrodes 41 are electrically connected with the second electrode pad 72 (referring to FIG. 1) by a not-illustrated contact.

Multiple trenches T1 are formed on the semiconductor region 37. The multiple trenches T1 are arranged in the X-direction; and each trench T1 extends in the Y-direction. Each trench T1 is located in the source region 33 and the base region 32 and reaches the semiconductor region 37.

The gate insulating film 51 is located in each trench T1; and the gate electrode 41 is located on the gate insulating film 51. An insulating portion 55 also is located in each trench T1 between the gate electrode 41 and the source electrode 61.

The source electrode 61 is located on the source region 33 and the gate electrode 41 and is electrically connected with the base region 32 and the source region 33. The gate electrode 41 and the source electrode 61 are electrically insulated from each other by the insulating portion 55 (a first insulating portion).

Similarly to the first element region R1, a base region 34 (a fourth semiconductor region), a source region 35 (a fifth semiconductor region), the gate electrode 42 (a second control electrode), and a gate insulating film 52 (a second insulating film) are located in the second element region R2. The second element MOS2 is a MOSFET that is formed of the gate insulating film 52, the gate electrode 42, the source region 35, the base region 34, and a portion of the semiconductor region 37.

The base region 34 is located selectively on the semiconductor region 37. The base region 34 is of the p-type (the second conductivity type).

The source region 35 is located selectively on the base region 34. The source region 35 is of the first conductivity type (the $n^+$-type). For example, the n-type impurity concentration of the source region 35 is greater than the n-type impurity concentration of the semiconductor region 37 and less than the n-type impurity concentration of the semiconductor region 31. Multiple source regions 35 are provided in the example; and the multiple source regions 35 are arranged in the X-direction.

The gate electrode 42 is located on the semiconductor region 37 with the gate insulating film 52 interposed. The gate electrode 42 faces a portion of the semiconductor region 37, the base region 34, and a portion of the source region 35 via the gate insulating film 52. Multiple gate electrodes 42 and multiple gate insulating films 52 are provided in the example. The multiple gate electrodes 42 are arranged in the X-direction; and each gate electrode 42 extends in the Y-direction. The gate electrode 42 is electrically connected with the fifth electrode pad 75 (referring to FIG. 1) by a not-illustrated contact.

Multiple trenches T2 are formed on the semiconductor region 37. The multiple trenches T2 are arranged in the X-direction; and each trench T2 extends in the Y-direction. Each trench T2 is located in the source region 35 and the base region 34 and reaches the semiconductor region 37. The gate insulating film 52 is located in each trench T2; and the gate electrode 42 is located on the gate insulating film 52. An insulating portion 56 also is located in each trench T2 between the gate electrode 42 and the source electrode 62.

The source electrode 62 is located on the source region 35 and the gate electrode 42 and is electrically connected with the source region 33 and the base region 34. The gate electrode 42 and the source electrode 62 are electrically insulated from each other by the insulating portion 56 (a second insulating portion).

Figure 3:
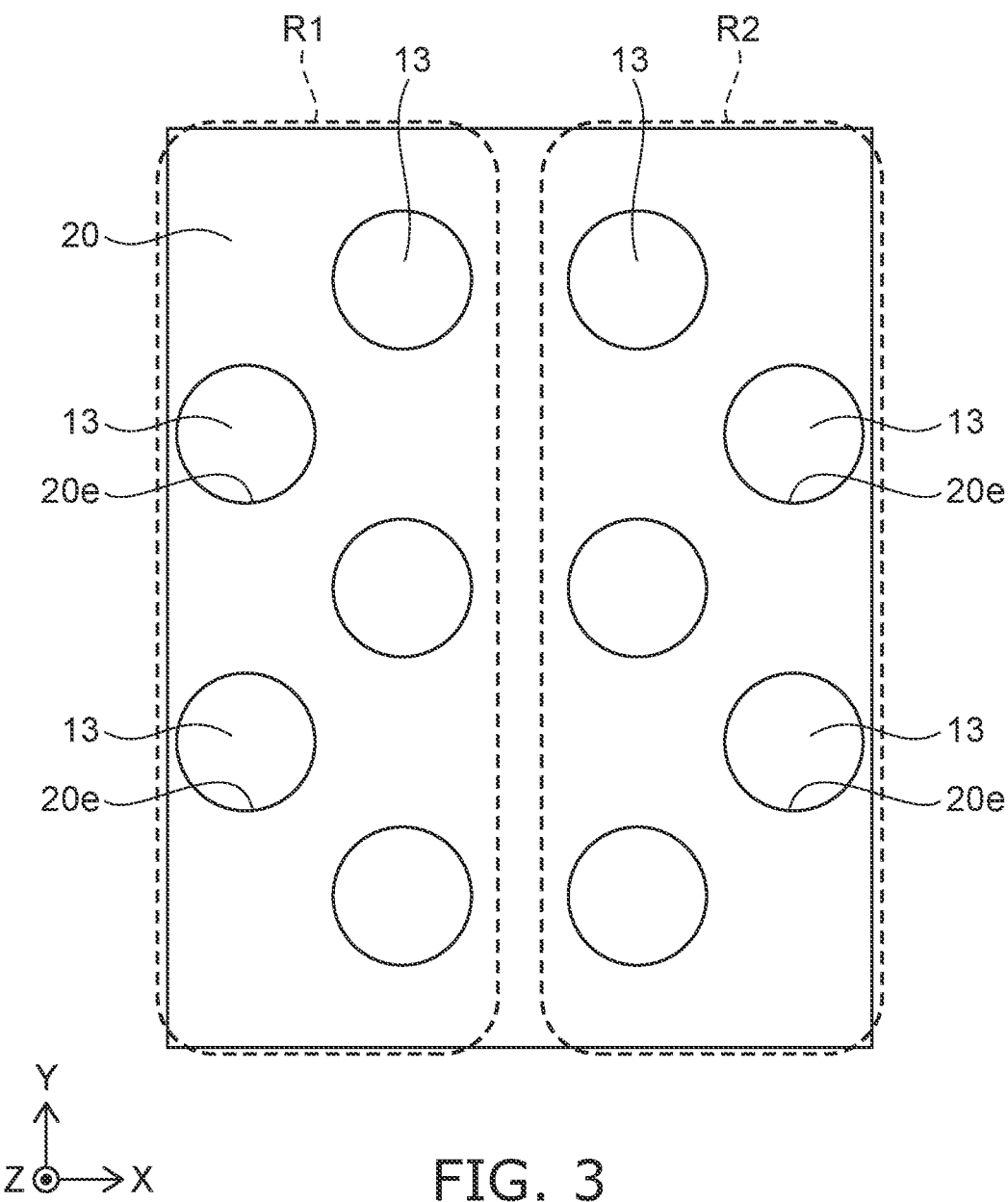
FIG. 3 is a cross-sectional view illustrating the semiconductor device according to the embodiment.

FIG. 3 is a cross-sectional view illustrating the semiconductor device according to the embodiment.

FIG. 3 illustrates a line A3-A4 cross section illustrated in FIG. 2. As illustrated in FIG. 3, the dielectric layer 20 includes an opening 20e. The conductive part 13 is located in the opening 20e. In other words, the conductive part 13 is surrounded with the dielectric layer 20 in the X-Y plane. The side surface of the conductive part 13 contacts the dielectric layer 20. In the example, the opening 20e is substantially circular. Therefore, the conductive part 13 is a circular column that connects the first metal layer 11 and the second metal layer 12. In other words, the dielectric layer 20 includes holes and is sandwiched between the first and second metal layers 11 and 12 which forms a two-layer metal structure.

In the example, when viewed from above, multiple conductive parts 13 are located in an area that overlaps the first element region R1 and an area that overlaps the second element region R2. For example, multiple conductive parts 13 are located under the source electrode 61; and multiple conductive parts 13 are located under the source electrode 62. For example, the multiple conductive parts 13 may be arranged at uniform spacing in the X-direction or the Y-direction.

Examples of the materials of the components of the semiconductor device 100 will now be described.

The semiconductor region 31, the semiconductor region 37, the base region 32, the source region 33, the base region 34, and the source region 35 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity. For example, the base region 32, the source region 33, the base region 34, and the source region 35 can be formed by ion-implanting an impurity into a silicon semiconductor substrate. At least one of the semiconductor region 31 or the semiconductor region 37 can include a semiconductor substrate. The semiconductor region 31 may be formed by ion-implanting an impurity.

The gate electrode 41 and the gate electrode 42 include a conductive material such as polysilicon doped with an impurity, etc.

The gate insulating film 51, the gate insulating film 52, the insulating portion 55, and the insulating portion 56 include an insulating material such as silicon oxide, etc.

The first metal layer 11, the second metal layer 12, the conductive part 13, the source electrode 61, and the source electrode 62 include a metal such as aluminum, copper, silver, titanium, tungsten, etc. The material of the first metal layer 11 and the material of the second metal layer 12 may be the same or different. The material of the conductive part 13 may be the same as or different from the material of the first or second metal layer 11 or 12.

The dielectric layer 20 includes aluminum oxide (e.g., $Al_2O_3$), silicon nitride (e.g., $Si_3N_4$), etc. The dielectric layer 20 is, for example, an insulator.

Operations of the semiconductor device 100 will now be described.

The semiconductor device 100 is operated by applying a gate bias to the gate electrodes 41 and 42 in a state in which a voltage is applied between the source electrode 61 and the source electrode 62. For example, when the MOSFETs are switched on by applying the gate bias to the gate electrodes 41 and 42, a current flows from the source electrode 61 toward the source electrode 62 as in a path CP1 shown in FIG. 2, and flows from the source electrode 62 toward the source electrode 61 as in a path CP2 shown in FIG. 2. The current may include a component that flows through the second metal layer 12 without passing through the conductive part 13 and the first metal layer 11.

The first metal layer 11, the second metal layer 12, and the conductive part 13 perform the role of a drain electrode for the first element MOS1 and the second element MOS2. In other words, the first element MOS1 and the second element MOS2 have a structure in which the drain electrode is shared.

For example, MOSFETs that have such a shared-drain structure can be used as a protection circuit of a battery pack (a rechargeable battery) of a smartphone, etc. For example, a battery is connected to the source electrode 61; and a power supply is connected to the source electrode 62. In such a case, the battery is charged by causing a current to flow from the power supply at the source electrode 62 side to the battery at the source electrode 61 side. Also, for example, a battery may be connected to the source electrode 61; and a battery pack may be connected to the source electrode 62. In such a case, the battery is discharged and the battery pack is charged by causing a current to flow from the battery at the source electrode 61 side to the rechargeable battery at the source electrode 62 side. A protection IC is connected to the gate electrodes 41 and 42; and the gate bias is controlled by the protection IC. The protection IC can suppress overcharge of the battery pack by controlling the gate bias. However, the semiconductor device according to the embodiment may not always have a shared-drain structure, and may not be a protection circuit of a battery pack.

Effects according to the embodiment will now be described.

A metal layer that is formed at the backside of a semiconductor region applies stress to the semiconductor region. Therefore, for example, when the metal layer is thick, etc., there is a risk that warp may occur in the wafer or chip in which the semiconductor device is provided. For example, the first metal layer 11 and the second metal layer 12 apply stress to the semiconductor region. Conversely, according to the embodiment, the dielectric layer 20 is located between the first metal layer 11 and the second metal layer 12. Thereby, the stress that is applied to the semiconductor region 31 can be relaxed more than when the metal layer is simply made thick without providing the dielectric layer 20. The warp of the wafer or chip can be suppressed thereby. Also, for example, the strength of the wafer or chip can be increased.

It is desirable for the stress that is applied to the semiconductor region 31 by the dielectric layer 20 to include a component in the opposite direction of the direction of the stress applied to the semiconductor region 31 by at least one of the first metal layer 11 or the second metal layer 12. The total stress that is applied to the semiconductor region 31 can be reduced thereby. In other words, the total stress that is generated in the entire wafer or chip can be reduced.

Thus, the dielectric layer 20 can perform the role of a strength protection layer or a stress buffer layer (a stress relaxation layer). Aluminum oxide and silicon nitride are favorable examples of the material of such a dielectric layer 20.

In the semiconductor device 100, the current flows through the semiconductor layer (the semiconductor regions 31 and 37, the base regions 32 and 34, and the source regions 33 and 35) along the vertical direction (the Z-direction). By thinning the semiconductor layer, the vertical-direction current path can be shorter, and the vertical-direction resistance component can be reduced. In other words, the on-resistance of the semiconductor device 100 can be reduced. However, there is a risk that thinning the semiconductor layer may reduce the flexural strength of the chip or wafer.

Also, the current flows through the drain electrode (e.g., the first metal layer 11 and the second metal layer 12) in the lateral direction (a direction along the X-Y plane). By making the drain electrode thick, the effective area through which the current flows can be increased, and the lateral-direction resistance component can be reduced. In other words, the on-resistance of the semiconductor device 100 can be reduced. However, when the metal layer (the drain electrode) is thick, the stress that the metal layer applies to the semiconductor layer is increased. Therefore, the effects of the film stress on the chip or wafer are increased, and there is a risk that the warp may increase.

In particular, when the semiconductor layer is thinned and the metal layer is made thick to reduce the on-resistance, there is a risk that the warp may be increased due to the effects of the film stress increase and the reduction of the flexural strength of the chip or wafer. In other words, it has been difficult to realize both a thin semiconductor layer and a thick metal layer. Conversely, according to the embodiment, the warp can be suppressed by providing the dielectric layer 20; therefore, it is easy to realize both a thin semiconductor layer and a thick metal layer (e.g., the first metal layer 11). According to the embodiment, the warp of the chip or wafer can be suppressed while reducing the on-resistance. The warp amount of the chip or wafer can be reduced compared to when the metal layer (the drain electrode) is simply made thick without providing the dielectric layer 20.

For example, the thickness of the semiconductor layer (the distance between the lower surface of the semiconductor region 31 and the upper surface of the source region 33) is not less than 15 μm and not more than 100 μm. The thickness of the semiconductor layer may be less than the thickness of the drain electrode (the distance between the lower surface of the first metal layer 11 and the upper surface of the second metal layer 12). The on-resistance can be reduced thereby.

The second metal layer 12 is thinner than the first metal layer 11. For example, it is sufficient for the second metal layer 12 to be thick enough to have an ohmic contact with the semiconductor region 31. Therefore, the stress that is due to the second metal layer 12 can be reduced by thinning the second metal layer 12. On the other hand, the on-resistance can be reduced by making the first metal layer 11 thick. The thickness of the dielectric layer 20 can be appropriately controlled to reduce the warp amount of the chip or wafer according to the thickness (the stress) of the first metal layer 11 (and the second metal layer 12). For example, the dielectric layer 20 is thicker than the second metal layer 12. The dielectric layer 20 may be thicker or thinner than the first metal layer 11.

FIGS. 4A and 4B and FIGS. 5A and 5B are cross-sectional views illustrating modifications of the semiconductor device according to the embodiment.

Figure 4A:
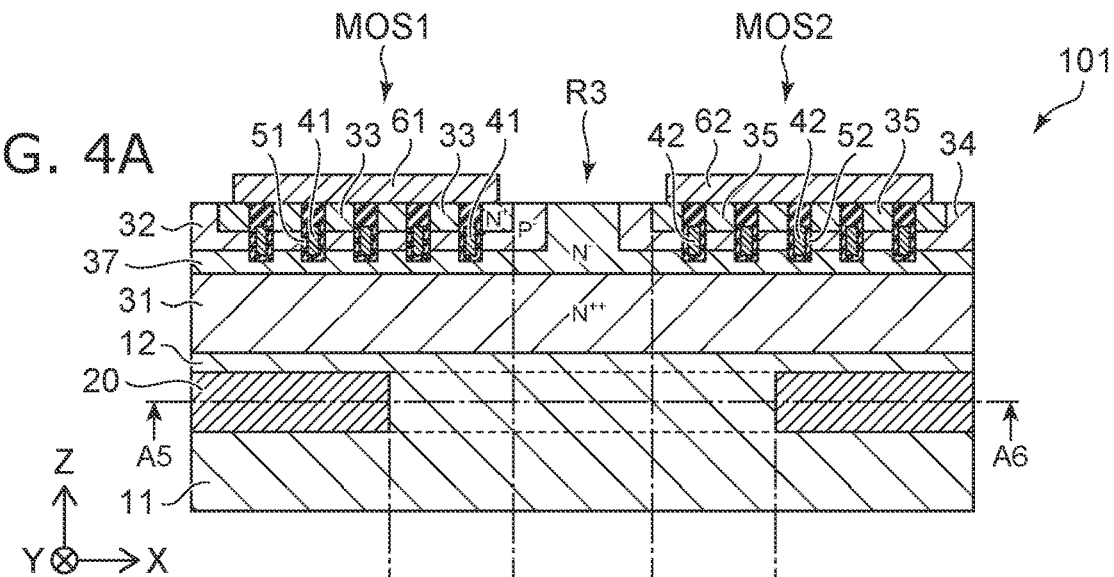
FIGS. 4A and 4B are cross-sectional views illustrating a modification of a semiconductor device according to the embodiment.
Figure 4B:
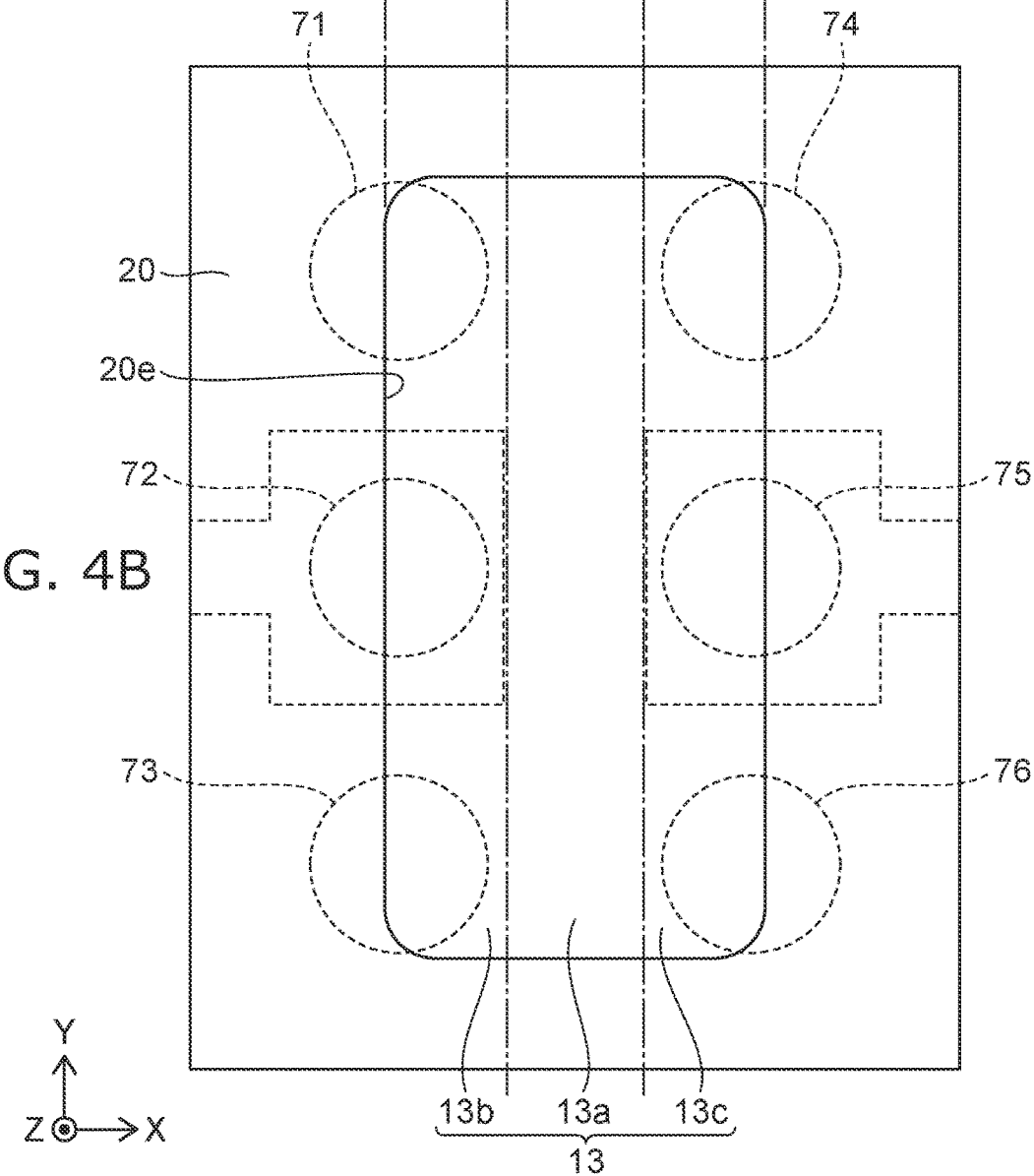
Figure 5A:
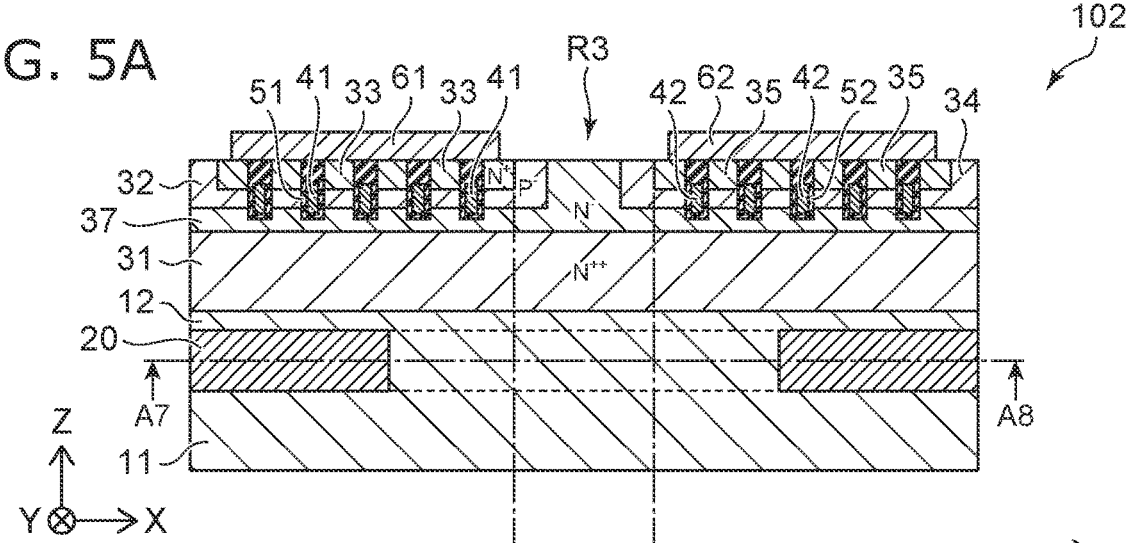
FIGS. 5A and 5B are cross-sectional views illustrating a modification of a semiconductor device according to the embodiment.
Figure 5B:
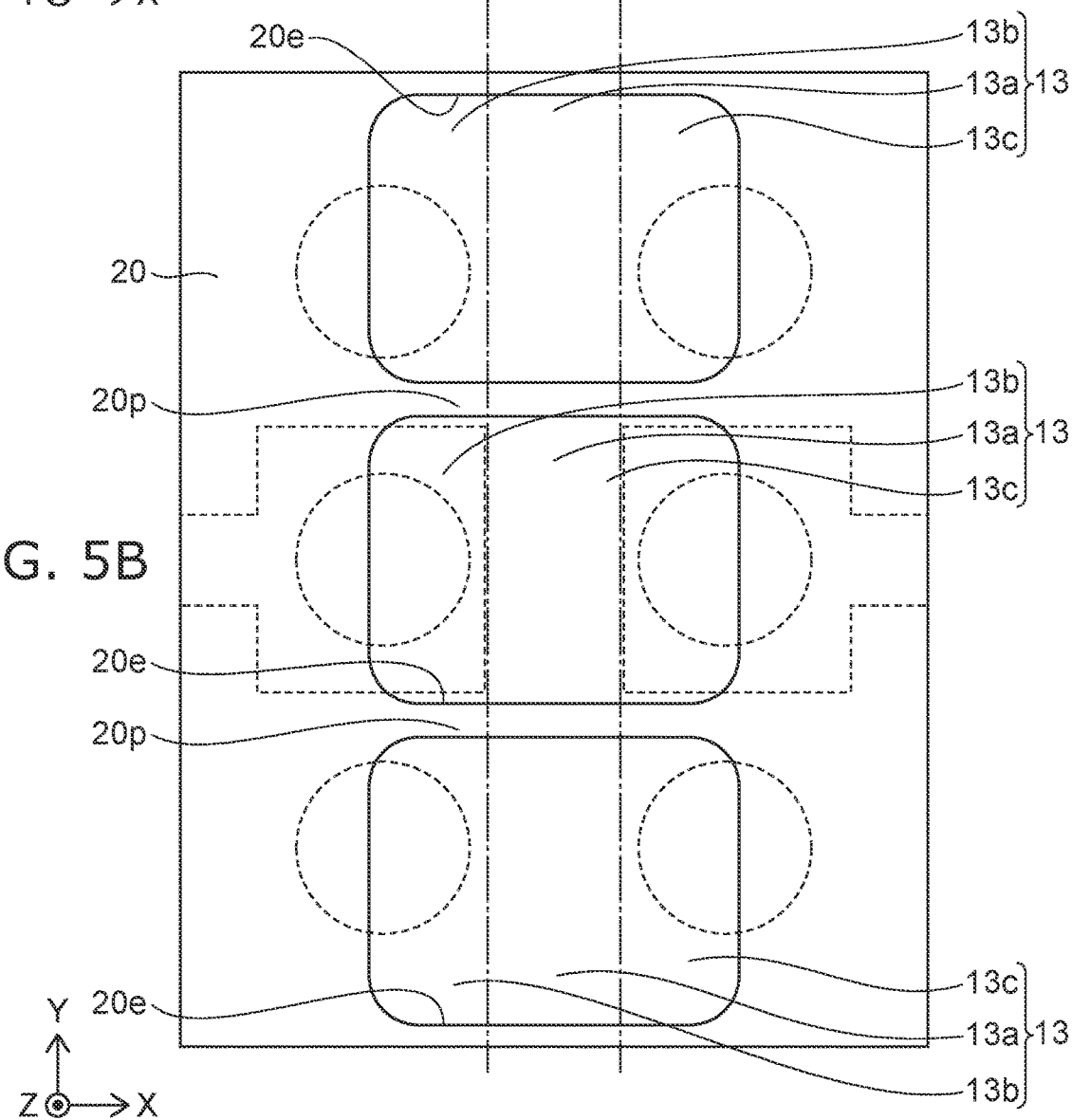

FIGS. 4A and 4B illustrate a semiconductor device 101; and FIGS. 5A and 5B illustrate a semiconductor device 102. The planar shapes of the dielectric layer 20 and the conductive part 13 of the semiconductor devices 101 and 102 are different from those of the semiconductor device 100 described above. Otherwise, the semiconductor devices 101 and 102 are similar to the semiconductor device 100.

FIG. 4B is a line A5-A6 cross section illustrated in FIG. 4A. The positions of the first to sixth electrode pads 71 to 76, etc., are illustrated by broken lines in FIG. 4B. In the example as illustrated in FIG. 4B, the dielectric layer 20 includes one opening 20e at the central portion. One conductive part 13 is located in the opening 20e.

The conductive part 13 includes a first portion 13a, a second portion 13b, and a third portion 13c. The first portion 13a, the second portion 13b, and the third portion 13c are continuous and are arranged in the X-direction. The first portion 13a is positioned between the second portion 13b and the third portion 13c. The first portion 13a overlaps the middle region R3 (the region between the source region 33 and the source region 35) in the Z-direction. In other words, the first portion 13a is positioned below the region between the first element MOS1 and the second element MOS2. The second portion 13b overlaps portions of the gate electrodes 41 and the source region 33 in the Z-direction. The third portion 13c overlaps portions of the gate electrodes 42 and the source region 35 in the Z-direction.

In the drain electrode of a semiconductor device that has a shared-drain structure, the current easily concentrates in the portion between the two transistors. Conversely, the conductive part 13 includes the first portion 13a, the second portion 13b, and the third portion 13c. In other words, the first metal layer 11 and the second metal layer 12 are connected by the conductive part 13 in the portion at which the current density is high. In other words, the dielectric layer 20 has a planar pattern that conducts between the current path portions of the two MOSFETs. Even when the dielectric layer 20 is provided, the increase of the resistance of the drain electrode can be suppressed thereby. By providing the dielectric layer 20, the semiconductor layer can be thinned; therefore, the total on-resistance can be reduced.

FIG. 5B is a line A7-A8 cross section illustrated in FIG. 5A. The positions of the first to sixth electrode pads 71 to 76, etc., are illustrated by broken lines in FIG. 5B. In the example as illustrated in FIG. 5B, the dielectric layer 20 includes multiple openings 20e along the Y-direction at the X-direction central portion. The conductive part 13 is located in each opening 20e.

Each conductive part 13 includes the first portion 13a, the second portion 13b, and the third portion 13c. Accordingly, in the example as well, the first metal layer 11 and the second metal layer 12 are connected by the conductive part 13 in the portion at which the current density is high; therefore, the increase of the resistance of the drain electrode can be suppressed.

The multiple conductive parts 13 are arranged in the Y-direction. A portion 20p of the dielectric layer 20 that extends in the X-direction is located between two adjacent conductive parts 13. The stress that is applied to the semiconductor region 31 by the first and second metal layers 11 and 12 can be suppressed by the portion 20p of the dielectric layer 20. For example, the portion 20p of the dielectric layer 20 applies stress to the semiconductor region 31 in the opposite direction of the first metal layer 11 and/or the conductive part 13.

The cross-sectional area of the current path can be widened by increasing the total surface area of the openings 20e (the total surface area in the X-Y plane of the multiple conductive parts 13); therefore, the increase of the on-resistance can be suppressed. By reducing the total surface area of the openings 20e, the surface area of the dielectric layer 20 that is the stress relaxation layer can be increased, and the warp can be further suppressed.

However, according to the embodiment, the planar pattern of the opening 20e (the planar pattern of the conductive part 13) is not limited to those described above. The surface area, width, spacing, number, etc., of the opening 20e are modifiable as appropriate. When multiple openings 20e are provided, the openings 20e that are at the chip central portion that is used as the current path may be wider than the openings 20e at the chip outer perimeter portion. A pattern of substantially circular openings 20e such as that illustrated in FIG. 3 and a pattern of substantially rectangular openings 20e such as those illustrated in FIG. 4B or FIG. 5B may be combined as appropriate.

A method for manufacturing the semiconductor device will now be described.

FIGS. 6A to 6D and FIGS. 7A to 7D are cross-sectional views illustrating the manufacturing method according to the embodiment.

Figure 6A:
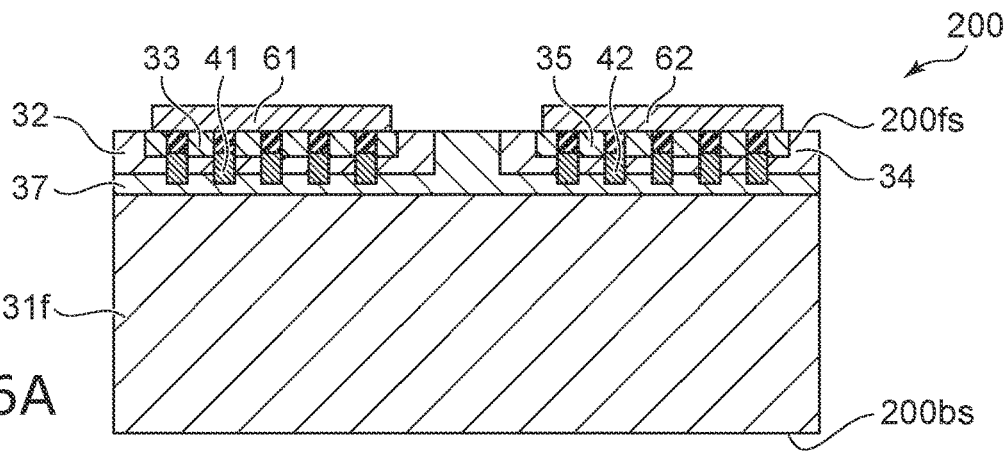
FIGS. 6A to 6D are cross-sectional views illustrating a manufacturing method according to the embodiment.

As shown in FIG. 6A, the semiconductor region 37, the base regions 32 and 34, the source regions 33 and 35, the gate electrodes 41 and 42, the gate insulating films 51 and 52, and the source electrodes 61 and 62 are provided in a front surface 200fs side of a substrate 200 (e.g., a silicon substrate). A back surface 200b side of the substrate 200 is a semiconductor film 31f that is used to form the semiconductor region 31. The gate insulating films are not illustrated for convenience.

Figure 6B:
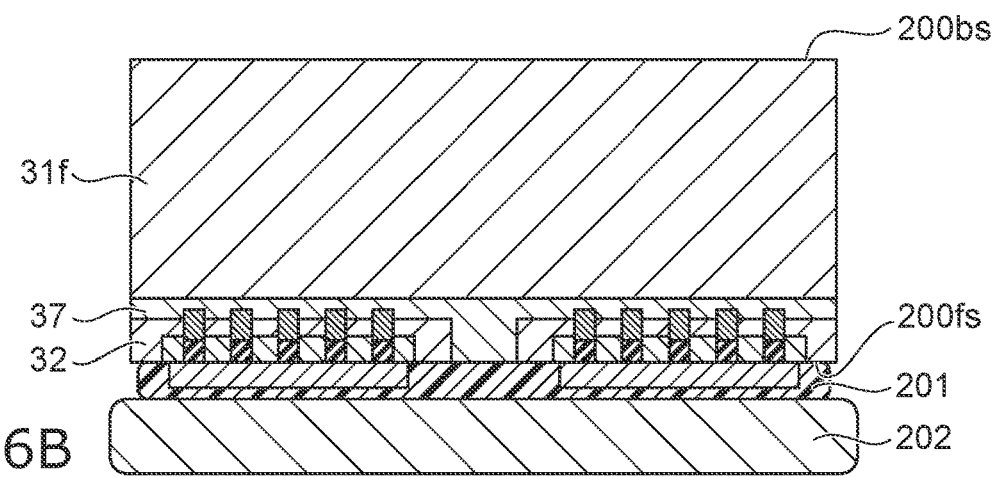

As shown in FIG. 6B, a support substrate 202 (e.g., a glass substrate) is adhered to the front surface 200fs side of the substrate 200 with an adhesive 201.

Figure 6C:
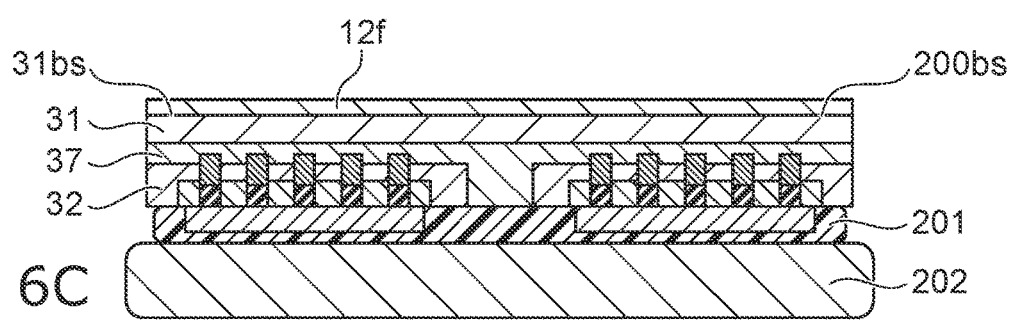

As shown in FIG. 6C, the substrate 200 is thinned by polishing the back surface 200b side of the substrate 200. The semiconductor region 31 is formed thereby. Then, a metal film 12f that is used to form the metal layer 12 is formed on the back surface 200b of the substrate 200, i.e., a back surface 31bs (the surface at the side opposite to the base region 32) of the semiconductor region 31. A method such as sputtering, vapor deposition, plating, etc., can be used to form the metal film 12f. The metal film 12f is, for example, a seed metal.

Figure 6D:
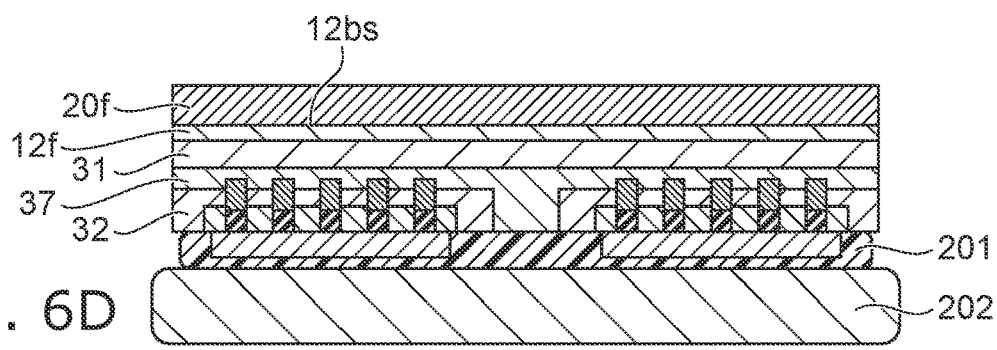

As shown in FIG. 6D, a dielectric film 20f that is used to form the dielectric layer 20 is formed on a back surface 12bs (the surface at the side opposite to the semiconductor region 31) of the metal film 12f. For example, the dielectric film 20f can be formed using a method in which film formation is not performed at a high temperature so that the quality of the adhesive 201 is not degraded. For example, coating and/or PEALD (Plasma Enhanced Atomic Layer Deposition) can be used.

Figure 7A:
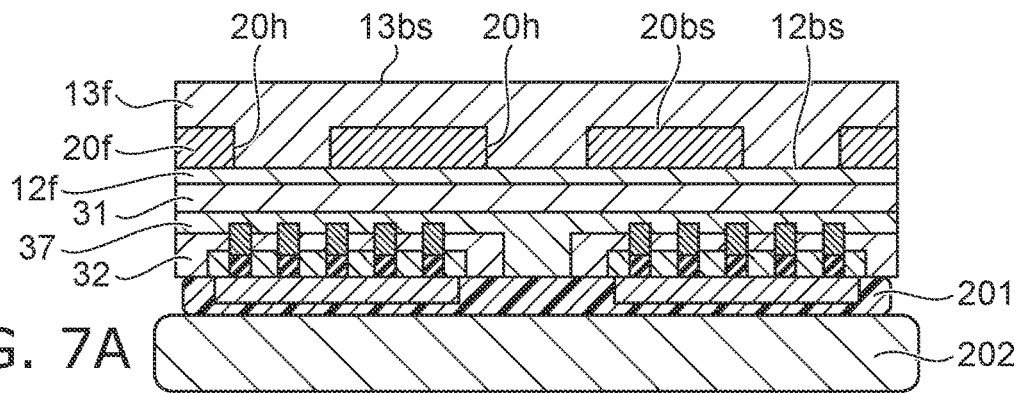
FIGS. 7A to 7D are cross-sectional views illustrating a manufacturing method according to the embodiment.

As shown in FIG. 7A, for example, a through-hole 20h is formed in the dielectric film 20f by RIE (reactive ion etching), etc. The metal film 12f is exposed in the through-hole 20h. The through-hole 20h corresponds to the opening 20e that is described above. Subsequently, a conductive film 13f that is used to form the conductive part 13 is formed on the back surface 12bs of the metal film 12f and a back surface 20bs (the surface at the side opposite to the metal film 12f) of the dielectric film 20f. The conductive film 13f can be formed using a method such as sputtering, vapor deposition, plating, etc.

Although the through-hole 20h is formed after forming the dielectric film 20f in the example, a method may be used in which a thin-film sheet having preformed holes is adhered.

Figure 7B:
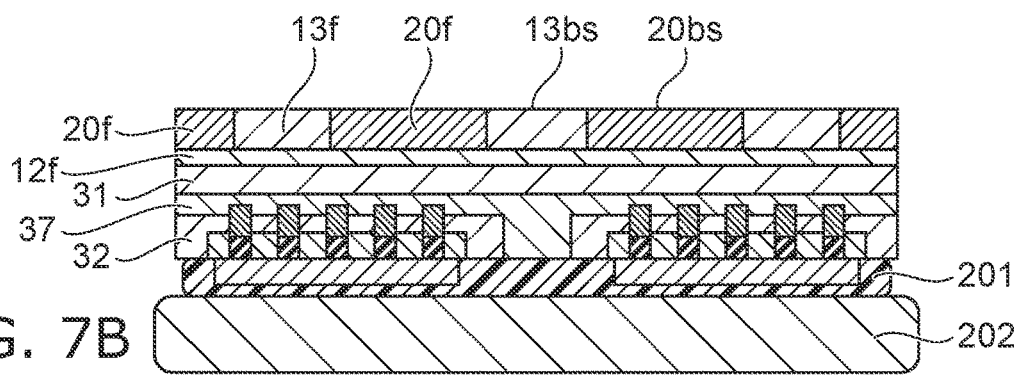

As shown in FIG. 7B, a back surface 13bs side (the surface at the side opposite to the metal film 12f) of the conductive film 13f is polished and planarized until the back surface 20bs of the dielectric film 20f is exposed.

Figure 7C:
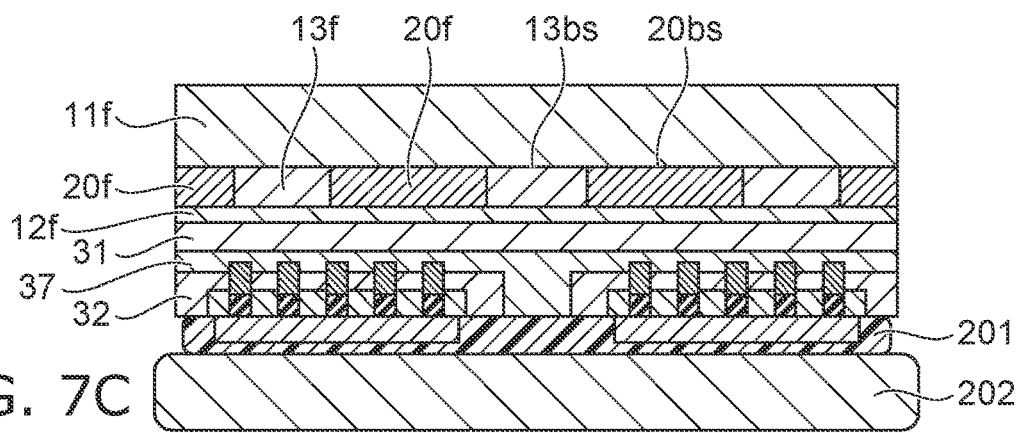

As shown in FIG. 7C, a metal film 11f that is used to form the metal layer 11 is formed on the back surface 20bs of the dielectric film 20f and the back surface 13bs of the conductive film 13f. The metal film 11f can be formed using a method such as sputtering, vapor deposition, plating, etc.

For example, the metal film 12f is thinner than the metal film 11f and thinner than the dielectric film 20f. Because the metal film 12f is thin, the stress that is applied to the substrate can be suppressed by the metal film 12f. For example, the load on the substrate in processes after forming the metal film 12f (e.g., the film formation of the dielectric film 20f, the formation of the through-hole 20h, etc.) can be suppressed thereby. Therefore, the substrate (the semiconductor layer) can be thinned, and the on-resistance of the semiconductor device can be reduced.

Figure 7D:
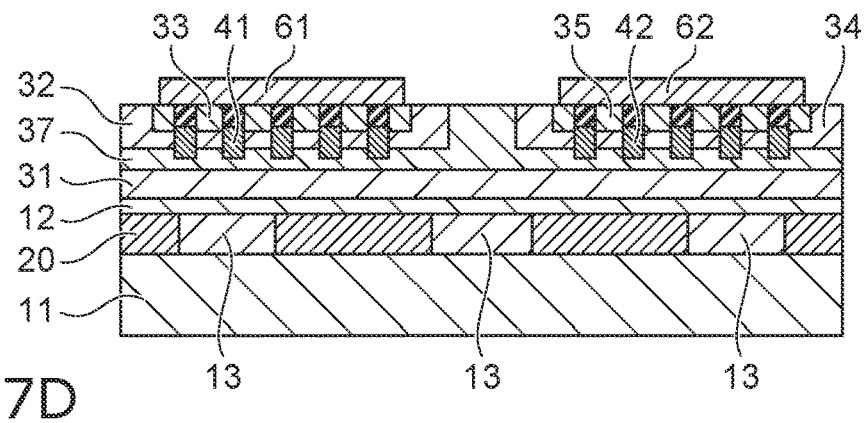

The adhesive 201 and the support substrate 202 are separated as shown in FIG. 7D. Also, the substrate is diced as appropriate. Thus, the semiconductor devices 100, 101, and 102 can be manufactured.

According to embodiments as described above, a semiconductor device can be provided in which the warp can be suppressed.

In each of the embodiments described above, the relative levels of the impurity concentrations between the semiconductor regions can be confirmed using, for example, SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by, for example, SIMS (secondary ion mass spectrometry).

In this specification, being "electrically connected" includes not only the case of being connected in direct contact, but also the case of being connected via another conductive member, etc.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a first metal layer;
a dielectric layer located on the first metal layer;
a second metal layer located on the dielectric layer, the second metal layer being electrically connected with the first metal layer;
a first semiconductor region located on the second metal layer and electrically connected with the second metal layer, the first semiconductor region being of a first conductivity type;
a second semiconductor region located on the first semiconductor region, the second semiconductor region being of a second conductivity type;
a third semiconductor region located on the second semiconductor region, the third semiconductor region being of the first conductivity type;
a first control electrode facing the second semiconductor region via a first insulating film; and
a first electrode located on the third semiconductor region and the first control electrode, the first electrode being electrically connected with the third semiconductor region, the first electrode being insulated from the first control electrode by a first insulating portion.

2. The device according to claim 1, further comprising:
a fourth semiconductor region located on the first semiconductor region, the fourth semiconductor region being of the second conductivity type;
a fifth semiconductor region located on the fourth semiconductor region, the fifth semiconductor region being of the first conductivity type;
a second control electrode facing the fourth semiconductor region via a second insulating film; and
a second electrode located on the fifth semiconductor region and the second control electrode, the second electrode being electrically connected with the fifth semiconductor region, the second electrode being insulated from the second control electrode by a second insulating portion.

3. The device according to claim 2, further comprising:
a conductive part arranged with the dielectric layer in a direction perpendicular to a first direction,
the first direction being from the first metal layer toward the second metal layer,
the conductive part electrically connecting the first metal layer and the second metal layer.

4. The device according to claim 3, wherein
a plurality of the conductive parts is located under the first electrode and under the second electrode.

5. The device according to claim 3, wherein
the conductive part includes a portion overlapping a middle region in the first direction, and
the middle region is between the third semiconductor region and the fifth semiconductor region.

6. The device according to claim 3, wherein
the conductive part includes:
a first portion overlapping the third semiconductor region in the first direction; and
a second portion overlapping the fifth semiconductor region in the first direction.

7. The device according to claim 5, wherein
a plurality of the conductive parts is provided.

8. The device according to claim 1, wherein
the second metal layer is thinner than the first metal layer.

9. The device according to claim 1, wherein
the dielectric layer includes at least one of silicon nitride or aluminum oxide.

10. The device according to claim 1, wherein
a portion of the dielectric layer is positioned between a portion of the first metal layer and the first electrode in a first direction, and
the first direction is from the first metal layer toward the second metal layer.

11. The device according to claim 2, wherein
a portion of the dielectric layer is positioned between a portion of the first metal layer and the second electrode in a first direction, and
the first direction is from the first metal layer toward the second metal layer.

12. The device according to claim 2, wherein
a first portion of the dielectric layer is positioned between a first portion of the first metal layer and the second semiconductor region in a first direction,
a second portion of the dielectric layer is positioned between a second portion of the first metal layer and the fourth semiconductor region in the first direction, and
the first direction is from the first metal layer toward the second metal layer.

13. The device according to claim 1, wherein
a thickness of the dielectric layer in a first direction is longer than a thickness of the second semiconductor region in the first direction, and
the first direction is from the first metal layer toward the second metal layer.

14. The device according to claim 1, wherein
a length of the dielectric layer in a second direction is longer than a length of the second semiconductor region in the second direction,
the second direction is perpendicular to a first direction, and
the first direction is from the first metal layer toward the second metal layer.

15. The device according to claim 1, wherein
a plurality of conductive parts is provided between the first metal layer and the second metal layer,
the dielectric layer is positioned around the plurality of conductive parts along a plane perpendicular to a first direction, and
the first direction is from the first metal layer toward the second metal layer.

* * * * *